US006629283B1

(12) United States Patent
Toyama

(10) Patent No.: US 6,629,283 B1
(45) Date of Patent: Sep. 30, 2003

(54) QUANTIZATION ERROR CORRECTING DEVICE AND METHOD, AND AUDIO INFORMATION DECODING DEVICE AND METHOD

(75) Inventor: Soichi Toyama, Tsurugashima (JP)

(73) Assignee: Pioneer Corporation, Tokyo-To (JP)

( * ) Notice: Subject to any disclaimer, the term of this patent is extended or adjusted under 35 U.S.C. 154(b) by 346 days.

(21) Appl. No.: 09/671,278

(22) Filed: Sep. 27, 2000

(30) Foreign Application Priority Data

Sep. 27, 1999 (JP) ........................................ P11-273084

(51) Int. Cl.[7] ......................... G06F 11/00; G06F 15/00; H03M 1/66; H03C 1/52

(52) U.S. Cl. ....................... 714/746; 341/144; 455/108; 375/270; 704/200

(58) Field of Search ................................ 714/744, 746, 714/776; 341/144; 455/108; 375/270; 704/200

(56) References Cited

U.S. PATENT DOCUMENTS 5,235,671 A * 8/1993 Mazor ........................ 704/200
5,325,374 A * 6/1994 Hoshi et al. ................ 714/759
5,485,469 A * 1/1996 Suzuki ....................... 714/774
5,586,193 A * 12/1996 Ichise et al. ................ 381/106
5,703,889 A * 12/1997 Shimoda et al. ............ 714/809
5,751,743 A * 5/1998 Takizawa .................... 714/774
5,924,060 A * 7/1999 Brandenburg ............... 704/200
6,021,386 A * 2/2000 Davis et al. ................ 704/229
6,067,319 A * 5/2000 Copeland .................... 375/232
6,246,345 B1 * 6/2001 Davidson et al. ............. 341/51
6,289,306 B1 * 9/2001 Van Der Vleuten et al. ..... 704/219
6,300,888 B1 * 10/2001 Chen et al. ................... 341/63
6,393,393 B1 * 5/2002 Kawahara ................... 704/229

* cited by examiner

*Primary Examiner*—David Ton
*Assistant Examiner*—Anthony T. Whittington
(74) *Attorney, Agent, or Firm*—Sughrue Mion, PLLC

(57) ABSTRACT

A quantization error correcting device corrects quantization error included in audio information at the time of decoding. The audio information is divided into a plurality of frequency bands and compressive-encoded for each frequency band with bit allocation determined based on audible frequency characteristic. The device includes: a detecting unit for detecting, based on bit allocation information indicating bit allocation and encoded values of the compressive-encoded audio information, a range of quantization error indicating a range in which audio information value before compressive-encoding corresponding to the encoded value exists; and an outputting unit for outputting a decoded value corresponding to one of the encoded values based on the detected range of quantization error and the ranges of quantization errors of other correlated ones of the encoded values.

20 Claims, 4 Drawing Sheets

T

| CONDITION | $I_{(k)}$ | $C_P$ , $I_{(k)}$ |
|---|---|---|
| ① $y_{(k-1)} > y_{(k)}$ & $y_{(k)} > y_{(k+1)}$ | 0 | $C_0$ , $I_{(0)}$ |
| | 1 | $C_0$ , $I_{(1)}$ |
| | 2 | $C_0$ , $I_{(2)}$ |
| | ⋮ | ⋮ |
| | N | $C_0$ , $I_{(N)}$ |
| ② $y_{(k-1)} < y_{(k)}$ & $y_{(k)} > y_{(k+1)}$ | 0 | $C_1$ . $I_{(0)}$ |
| | 1 | $C_1$ , $I_{(1)}$ |
| | 2 | $C_1$ , $I_{(2)}$ |
| | ⋮ | ⋮ |
| | N | $C_1$ , $I_{(N)}$ |
| ③ $y_{(k-1)} > y_{(k)}$ & $y_{(k)} < y_{(k+1)}$ | 0 | $C_2$ , $I_{(0)}$ |
| | 1 | $C_2$ , $I_{(1)}$ |
| | 2 | $C_2$ , $I_{(2)}$ |
| | ⋮ | ⋮ |
| | N | $C_2$ , $I_{(N)}$ |
| ④ $y_{(k-1)} < y_{(k)}$ & $y_{(k)} < y_{(k+1)}$ | 0 | $C_3$ , $I_{(0)}$ |
| | 1 | $C_3$ , $I_{(1)}$ |
| | 2 | $C_3$ , $I_{(2)}$ |
| | ⋮ | ⋮ |
| | N | $C_3$ . $I_{(N)}$ |

QUANTIZATION ERROR CORRECTING DEVICE AND METHOD, AND AUDIO INFORMATION DECODING DEVICE AND METHOD

BACKGROUND OF THE INVENTION

1. Field of the Invention

The present invention relates to a quantization error correcting method and device, and audio information decoding method and device including the quantization error correcting method and device. More specifically, the present invention relates to a method and a device for correcting quantization error generated during decoding compressive-encoded audio information.

2. Description of Related Art

In order to record audio information (including voice information and other sound information, hereinafter used in the same meaning) of long playback time onto an information storage medium (e.g., an optical disc) having limited recording capacity, audio information is subjected to compressive-encoding (generally also referred to as "high-efficiency encoding") before it is recorded on an information storage medium.

As a compressive-encoding method for audio information to be recorded, there is known a method which divides audio information into a plurality of frequency bands, and then encodes the audio information by the frequency band unit using appropriately allocated bit numbers (different from each other in different frequency bands). Specifically, according to a digital compression method called "Sub-band encoding", an audio signal including audio information of time domain is divided into blocks of some samples, and a time-frequency conversion using orthogonal base, such as Modified Discrete Cosine Transform (MDCT), is applied to each block to obtain conversion coefficient in frequency domain. Then, the signal is frequency-divided by a digital compression method for quantizing by the conversion coefficient unit (called "conversion encoding method), and/or a filter bank including Band Pass Filters, High Pass Filters and Low Pass Filters. Then, the resultant signal is decimated according to the divided frequency band widths, and then quantized by the frequency band unit.

In the bit allocation (i.e., step of allocating bit number), in consideration of so-called masking effect, small bit number is allocated to a frequency band generally inaudible to human being and large bit number is allocated to a frequency band audible to human being. Thus, compressive-encoding is performed with efficiently reducing total information amount of audio information. It is noted that the masking effect is that, if there are sound of high sound pressure and low sound pressure in near frequency band to each other, human being is hardly recognize sound of low sound pressure level (especially if sound of low sound pressure has higher frequency than that of the sound of high sound pressure).

According to the compressive-encoding method described above, the information amount is efficiently reduced with suppressing the deterioration of sound quality in consideration of audible characteristic of human being, thereby effectively compressive-encoding audio information.

However, there is a problem that the decoding accuracy may be degraded for audio information encoded with small bit number. Namely, for the audio information encoded with small bit number, the difference between digital value before the encoding and after the decoding increases.

In view of the recent trend which regards high sound quality as a significant factor, it is desirable that even audio information inaudible due to the masking effect is reproduced with high fidelity in order to achieve high accuracy reproduction of whole audio information.

SUMMARY OF THE INVENTION

It is an object of the present invention to provide a quantization error correction method and device capable of improving decoding accuracy of audio information encoded with small bit number.

It is another object of the present invention to provide audio information decoding method and device which take advantage of the above improved decoding accuracy to achieve high accuracy decoding of whole audio information.

According to one aspect of the present invention, there is provided a quantization error correcting device for correcting quantization error included in audio information at the time of decoding, the audio information being divided into a plurality of frequency bands and compressive-encoded for each frequency band with bit allocation determined based on audible frequency characteristic, the device including: a detecting unit for detecting, based on bit allocation information indicating bit allocation and encoded values of the compressive-encoded audio information, a range of quantization error indicating a range in which audio information value before compressive-encoding corresponding to the encoded value exists; and an outputting unit for outputting a decoded value corresponding to one of the encoded values based on the detected range of quantization error and the ranges of quantization errors of other correlated ones of the encoded values.

According to the same aspect of the present invention, there is provided a quantization error correcting method for correcting quantization error included in audio information at the time of decoding, the audio information being divided into a plurality of frequency bands and compressive-encoded for each frequency band with bit allocation determined based on audible frequency characteristic, the method including the steps of: detecting, based on bit allocation information indicating bit allocation and encoded values of the compressive-encoded audio information, a range of quantization error indicating a range in which audio information value before compressive-encoding corresponding to the encoded value exists; and outputting a decoded value corresponding to one of the encoded values based on the detected range of quantization error and the ranges of quantization errors of other correlated ones of the encoded values.

In accordance with the above device or method, the decoded value corresponding to one of the encoded values is outputted based on the detected range of quantization error and the ranges of quantization errors of other correlated ones of the encoded values. Therefore, the quantization error in the audio information of the frequency band which is compressive-encoded with small bit number according to the bit allocation at the time of the encoding may be corrected, and the decoding accuracy may be improved.

The outputting unit or step may correct the quantization error corresponding to the one of the encoded value using Least Mean Square method based on the detected range of the quantization error and the ranges of the quantization errors of the other correlated ones of the encoded values, and output the decoded value. Thus, the decoded value may be outputted highly accurately by the LMS method.

The other correlated ones of the encoded value may include the encoded values which are compressive-encoded in the frequency bands neighboring to the frequency band in which the one of the encoded value is obtained. By this, the quantization error may be corrected by simple processing.

According to another aspect of the present invention, there is provided a quantization error correcting device for correcting quantization error included in audio information at the time of decoding, the audio information being divided into a plurality of frequency bands and compressive-encoded for each frequency band with bit allocation determined based on audible frequency characteristic, the device including: a memory for storing correction values for correcting the encoded values for each frequency band, the correction values being calculated based on, at least, an error between the encoded value of the compressive-encoded audio information and audio information value before compressive-encoding, and a level of the encoded value in other correlated ones of the encode values; and an outputting unit for reading out the correction value from the memory based on the bit allocation information indicating the bit allocation and the encoded value, and for outputting decoded value corresponding to the encoded value for each frequency band based on the correction value read out from the memory and the encoded value.

According to the same aspect of the present invention, there is provided a quantization error correcting method for correcting quantization error included in audio information at the time of decoding, the audio information being divided into a plurality of frequency bands and compressive-encoded for each frequency band with bit allocation determined based on audible frequency characteristic, the method including the steps of: storing correction values for correcting the encoded values for each frequency band into a memory, the correction values being calculated based on, at least, an error between the encoded value of the compressive-encoded audio information and audio information value before compressive-encoding, and a level of the encoded value in other correlated ones of the encode values; and reading out the correction value from the memory based on the bit allocation information indicating the bit allocation and the encoded value, and for outputting decoded value corresponding to the encoded value for each frequency band based on the correction value read out from the memory and the encoded value.

In accordance with the device or method, the correction value is read out from the memory based on the bit allocation information and the encoded value, and the decoded value corresponding to the encoded value is outputted for each frequency band based on the correction value read out from the memory and the encoded value. Therefore, the quantization error in the audio information of the frequency band which is compressive-encoded with small bit number according to the bit allocation at the time of the encoding may be corrected, and the decoding accuracy may be improved.

The compressive-encoding of the audio information may be conversion encoding or sub-band encoding for each of the frequency bands.

According still another aspect of the present invention, there is provided an audio information decoding device including: the quantization error correction device described above; and a decoding unit for applying decoding processing corresponding to the compressive-encoding of the audio information onto the outputted decoded value and for outputting decoding result.

According to the same aspect of the present invention, there is provided an audio information decoding method including: the quantization error correction method described above; and a step of applying decoding processing corresponding to the compressive-encoding of the audio information onto the outputted decoded value and outputting decoding result.

In accordance with the device or method, it is possible to generate decoded value in which quantization error in the audio information of the frequency band compressive-encoded with small bit number is corrected, and hence the decoding accuracy of the audio information may be improved.

The nature, utility, and further features of this invention will be more clearly apparent from the following detailed description with respect to preferred embodiment of the invention when read in conjunction with the accompanying drawings briefly described below.

BRIEF DESCRIPTION OF THE DRAWINGS

FIGS. 1A and 1B are block diagrams showing configuration of an audio information decoding device according to the first embodiment, wherein FIG. 1A shows a whole configuration and FIG. 1B shows detailed configuration of an error correction unit;

FIGS. 2A and 2B are schematic diagram showing decoding processing according to the first embodiment, wherein FIG. 2A shows the range of quantization error and FIG. 2B illustrates the calculation of corrected value using Least Mean Square (LMS) method;

FIGS. 3A and 3B are block diagrams showing configuration of an audio information decoding device according to the second embodiment, wherein FIG. 3A shows detailed configuration of an error correction unit and FIG. 3B shows a table stored in the memory;

FIGS. 4A and 4B are block diagrams showing configuration of an audio information decoding device according to the third embodiment, wherein FIG. 4A shows whole configuration and FIG. 4B shows detailed configuration of a decoding unit.

DETAILED DESCRIPTION OF THE PREFERRED EMBODIMENTS

The preferred embodiments of the present invention will now be described below with reference to the attached drawings.

It is noted that the following embodiments are directed to the cases where the present invention is applied to an audio information decoding device for decoding audio information compressive-encoded with the bit allocation for frequency bands considering the masking effect. The audio information is supplied from an information storage medium such as an optical disc or supplied in the form of broadcasting radio wave, is frequency-divided into plural frequency bands and then is compressive-encoded with the bit allocation in consideration of masking effect. Specifically, in the bit allocation processing, small bit number is allocated to audio information of inaudible frequency band and large bit number is allocated to audio information of audible frequency band, and thus whole audio information is compressive-encoded with appropriately reducing information amount.

[I] 1st Embodiment

The first embodiment of the present invention will be described with reference to FIGS. 1A, 1B, 2A and 2B. FIGS.

Figure 2A:
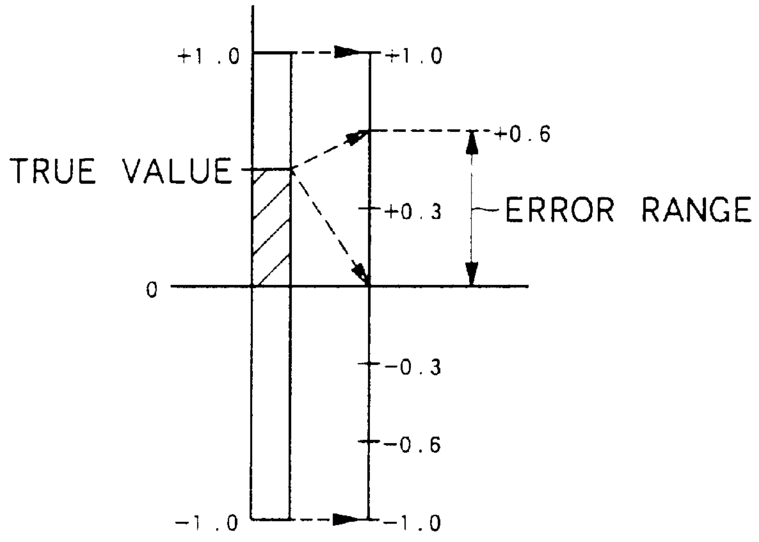
Figure 2B:
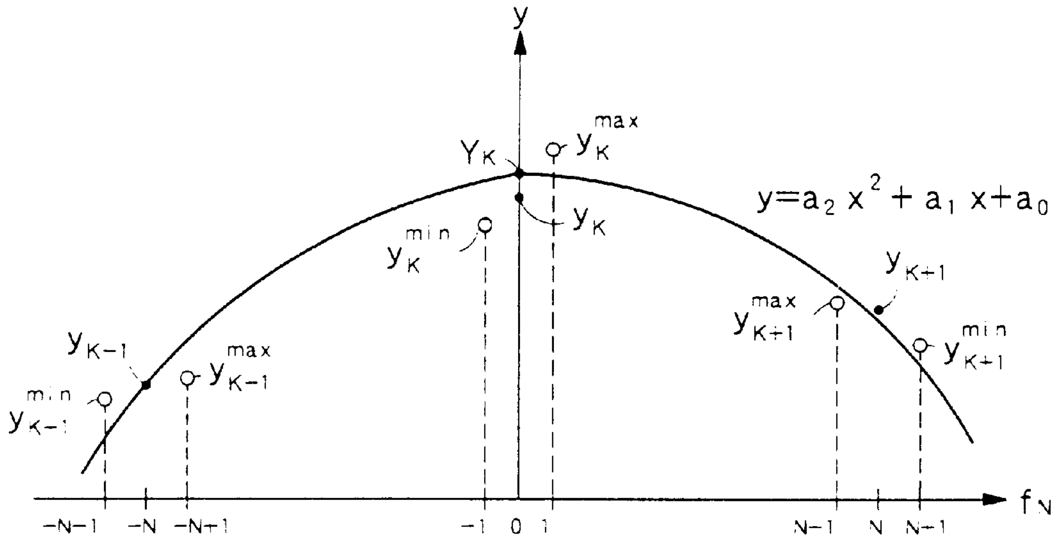

1A and 1B are block diagrams showing configuration of an audio information decoding device according to the first embodiment, and FIGS. 2A and 2B are schematic diagrams showing decoding processing according to the first embodiment.

Figure 1A:
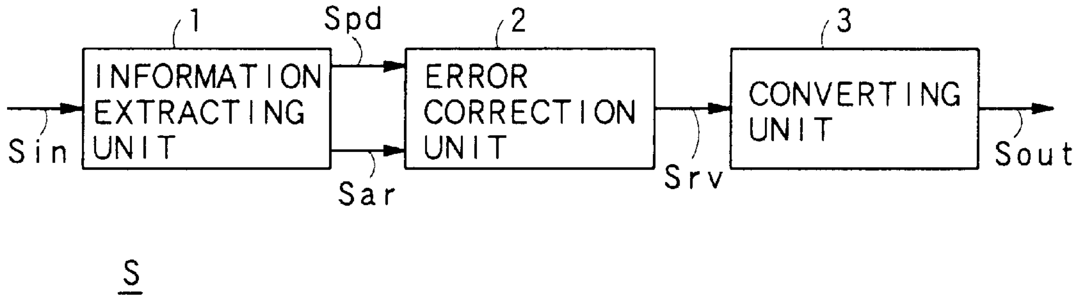

As shown in FIG. 1A, the audio information decoding device S of the first embodiment includes an information extracting unit 1, an error correction unit 2 and a converting unit 3 serving as a decoding unit.

The operation will be described. To the information extracting unit 1, audio information Sin to be decoded is supplied from an information storage medium or broadcasting radio wave. The audio information Sin was frequency-divided and then compressive-encoded with the bit allocation which takes account of the masking effect of human being. The audio information Sin includes bit allocation information indicating the bit allocation for each divided frequency band, in addition to the compressive-encoded audio information body. In the first embodiment, the above-mentioned conversion encoding method is used as an example of the compressive-encoding method.

The information extracting unit 1 extracts the audio information body and the bit allocation information from the audio information Sin to generate audio data Spd, including the audio information body, and allocation data Sar, and supplies them to the error correction unit 2. The error correction unit 2 utilizes the audio data Spd and the allocation data Sar during the correction processing described later in detail to correct quantization error included in the audio data Spd, generates corrected data Srv including audio information of frequency domain, and supplies it to the converting unit 3. Then, the converting unit 3 converts the corrected data Srv from the frequency domain to the time domain, generates decoded data Sout serving as decoded audio information, and supplies it to outside.

Figure 1B:
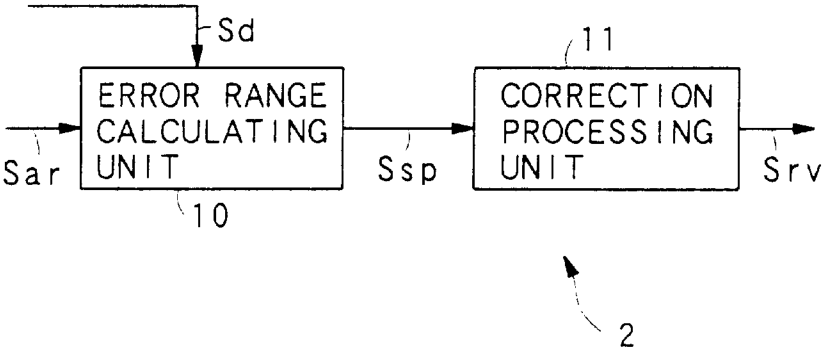

Next, the detailed configuration and operation of the error correction unit 2 will be described with reference to FIGS. 1B, 2A and 2B. As shown in FIG. 1B, the error correction unit 2 of the first embodiment includes an error range calculating unit 10 and a correction processing unit 11. Next, the operation will be described. First, the error range calculating unit 10 calculates the range of the quantization error included in the respective encoded values in the audio data Spd (i.e., the encoded values of the audio information supplied from an information storage medium or from broadcasting radio wave) on the basis of the bit allocation information included in the allocation data Sar, generates range data Ssp indicating the range and supplies it to the correction processing unit 11.

The range of the quantization error will be described with reference to FIG. 2A. The above mentioned encoded values are obtained, in the encoding step, by quantizing the true value of the sound level of the audio information before encoding (true value for each frequency band divided in consideration of the masking effect) with the bit number allocated to the frequency band. Namely, assuming that a certain true value (normalized to be within the range of ±1.0) in a certain frequency band shown in FIG. 2A is encoded by 2-bit symmetrical quantization method, the encoded value is +0.3 (+0.333 . . . ). Thus, the encoded value is supplied to the audio decoding device S of the first embodiment from the information storage medium or broadcasting radio wave as the audio information Sin together with the bit allocation information. On the other hand, considering now to decode the encoded value thus obtained, since the audio information decoding device S receives only the encoded values and the corresponding bit allocation information, the audio decoding device S cannot accurately obtain the original true value. When decoding the encoded value to obtain the original true value in the example of FIG. 2A, if the encoded value produced by the symmetrical quantization using 2-bit allocation is +0.3, the original true value must range from the minimum value “0” to the maximum value “+0.6”. This range from “0” to “+0.6” is the quantization error range in the first embodiment. This error range is calculated by the error range calculation unit 10 in the above described way, and is supplied to the correction processing unit 11 as the range data Ssp including the minimum and maximum values for the respective frequency bands. The correction processing unit 11, to which the range data Ssp is supplied, corrects the quantization error included in the encoded value of certain frequency band, by the processing described later, based on the maximum and minimum values corresponding to the encoded values of neighboring frequency bands and the maximum and minimum values of the encoded values of the frequency bands in-between. Then, the correction processing unit 11 generates the corrected data Srv and supplies it to the converting unit 3.

This correction processing will be described with reference to FIG. 2B. First, since it can be generally understood that audio information before encoding rarely be discontinuous in the frequency domain, the encoded values of the frequency bands neighboring to each other in the frequency axis have correlation with each other in most cases. In this view, the first embodiment utilizes this correlation, and calculates the corrected value for the original true value from the quantization error ranges calculated in the neighboring frequency bands by the approximation described below. More specifically, when a corrected value $Y_k$ (k is a number of transmitted encoded value) is calculated by using the respective quantization error ranges corresponding $n_1$ ($n_1 \geqq 0$) frequency bands at the low frequency side and $n_H$ ($n_H \geqq 0$) frequency bands at the high frequency side of the frequency band corresponding to the encoded value from which the corrected value is to be calculated, the following approximation is used:

$$Y_k = \sum_{k=1}^{m} a_k x^{k-1},\ m \geqq n_l + n_h + 1$$

The calculation method of the coefficient $a_k$ will be described with reference to FIG. 2B. In the first embodiment, so-called Least Mean Square (LMS) method is used. Namely, $n_1$ and $n_h$ are assumed to be “1”, the k-th transmitted encoded value is assumed to be $y_k$, the minimum value of the quantization error range calculated by the error range calculating unit 10 is assumed to be $y_k^{min}$, the maximum value of the quantization error range is assumed to be $y_k^{max}$, and the corrected value to be calculated is assumed to be $Y_k$. Then, assuming that an initial value of the interval on the frequency axis used in calculation of the corrected value using the Least Mean Square method is N, the following six combinations of the coordinate values are calculated in accordance with the classification of the magnitude relation of the neighboring encoded values $y_k$, $y_{k-1}$ and $y_{k+1}$.

TABLE 1

| No. | CONDITION BETWEEN NEIGHBORING ENCODED VALUES | COMBINED COORDINATE VALUES |
|---|---|---|
| ① | $y_{k-1} < y_k < y_{k+1}$ | $(-N-1, y_{k-1}^{min})$, $(-N+1, y_{k-1}^{max})$, $(-1, y_k^{min})$, $(1, y_k^{max})$, $(N-1, y_{k+1}^{min})$, $(N+1, y_{k+1}^{max})$ |
| ② | $y_{k-1} < y_k$, $y_k > y_{k+1}$, $y_{k-1} > y_{k+1}$ | $(-N-1, y_{k-1}^{min})$, $(-N+1, y_{k-1}^{max})$, $(-1, y_k^{max})$, $(1, y_k^{min})$, $(N-1, y_{k+1}^{max})$, $(N+1, y_{k+1}^{min})$ |
| ③ | $y_{k-1} < y_k$, $y_k > y_{k+1}$, $y_{k-1} < y_{k+1}$ | $(-N-1, y_{k-1}^{min})$, $(-N+1, y_{k-1}^{max})$, $(-1, y_k^{min})$, $(1, y_k^{max})$, $(N-1, y_{k+1}^{max})$, $(N+1, y_{k+1}^{min})$ |
| ④ | $y_{k-1} > y_k$, $y_k < y_{k+1}$, $y_{k-1} > y_{k+1}$ | $(-N-1, y_{k-1}^{max})$, $(-N+1, y_{k-1}^{min})$, $(-1, y_k^{max})$, $(1, y_k^{min})$, $(N-1, y_{k+1}^{min})$, $(N+1, y_{k+1}^{max})$ |
| ⑤ | $y_{k-1} > y_k$, $y_k < y_{k+1}$, $y_{k-1} < y_{k+1}$ | $(-N-1, y_{k-1}^{max})$, $(-N+1, y_{k-1}^{min})$, $(-1, y_k^{min})$, $(1, y_k^{max})$, $(N-1, y_{k+1}^{min})$, $(N+1, y_{k+1}^{max})$ |
| ⑥ | $y_{k-1} > y_k > y_{k+1}$ | $(-N-1, y_{k-1}^{max})$, $(-N+1, y_{k-1}^{min})$, $(-1, y_k^{min})$, $(1, y_k^{max})$, $(N-1, y_{k+1}^{max})$, $(N+1, y_{k+1}^{min})$ |

Next, for those six cases, the coefficients $a_0$, $a_1$ and $a_2$ are calculated by solving the following matrix with the quadric curve approximation using the LMS method. It is noted that, in the following matrix, k=6 because the number of coordinates included in the respective coordinate combination is six, and those six coordinates are expressed as $(x_1, y_1)$, $(x_2, y_2)$, . . . $(x_6, y_6)$.

$$\begin{pmatrix} 6 & \sum_{I=1}^{6} X_i & \sum_{i=1}^{6} x_i^2 \\ \sum_{i=1}^{6} x_i & \sum_{i=1}^{6} x_i^2 & \sum_{i=1}^{6} x_i^3 \\ \sum_{i=1}^{6} x_i^2 & \sum_{i=1}^{6} x_i^3 & \sum_{i=1}^{6} x_i^4 \end{pmatrix} \begin{pmatrix} a_0 \\ a_1 \\ a_2 \end{pmatrix} = \begin{pmatrix} \sum_{i=1}^{6} y_i \\ \sum_{i=1}^{6} y_i x_i \\ \sum_{i=1}^{6} y_i x_i \end{pmatrix}$$

Here, FIG. 2B shows an example of the relation between the quadric approximation curve used in the calculation of the corrected value $Y_k$ and the six coordinates in the case of the condition No. 3 in Table 1. In FIG. 2B, the horizontal axis shows a normalized frequency $f_N$ and the vertical axis shows the encoded value y. By substituting $f_N=0$ to the above approximation equation including the calculated coefficients $a_0$, $a_1$ and $a_2$, the corrected value $Y_k$ can be calculated as $Y_k=a_0$. Thereafter, the corrected value $Y_k$ is supplied to the converting unit 3, in place of the transmitted encoded value $y_k$, as the corrected data Srv.

As described above, according to the operation of the error correction unit 2 of the first embodiment, the corrected value $Y_k$ corresponding to one encoded value $y_k$ is outputted based on the detected quantization error range and the quantization error ranges corresponding to the encoded values $y_{k-1}$ and $y_{k+1}$ of the frequency bands neighboring to each other on the frequency axis. Therefore, the quantization error in the audio information of the frequency band which is compressive-encoded with small bit number in the bit allocation may be corrected, and the decoding accuracy of the audio information may be improved. In addition, since the corrected value $Y_k$ is calculated by LMS method, the highly accurate correction can be achieved. Further, since the corrected value $Y_k$ corresponding to one encoded value $y_k$ is outputted based on the detected quantization error range and the quantization error ranges corresponding to the encoded values $y_{k-1}$ and $y_{k+1}$ of the frequency bands neighboring to each other on the frequency axis, the quantization error can be corrected by simple processing, thereby improving the decoding accuracy of the audio information. Still further, the decoding accuracy of the audio information compressive-encoded by the conversion encoding of the frequency band unit is improved, and hence whole audio information may be decoded with high sound quality.

In the error correction processing of the first embodiment described above, if the corrected value $Y_k$ calculated by the LMS method is smaller than the minimum value $y_k^{min}$ or larger than the maximum value $y_k^{max}$ of the quantization error for the original encoded value $y_k$, the series of correction value calculation described above should be executed with setting the initial value N of the interval in the frequency axis direction to N+Δ to calculate new corrected value $Y_k$. Then, this processing is repeated until the calculated corrected value $Y_k$ becomes larger than the minimum value $y_k^{min}$ and smaller than the maximum value $y_k^{max}$, thereby finally obtaining the corrected value $Y_k$.

In the corrected value calculation of the first embodiment described above, the corrected value $Y_k$ is calculated using the quantization error ranges corresponding to the encoded values $y_{k-1}$ and $y_{k+1}$ neighboring to each other in the frequency axis. Alternatively, the corrected value may be calculated by using two quantization error ranges corresponding to two encoded values in the frequency bands which are not neighboring but close to each other. Alternatively, the corrected value may be calculated by using the quantization error ranges corresponding to the encoded values of other frequency bands located in only low or high frequency side.

Furthermore, in some cases, the calculated corrected value $Y_k$ becomes smaller than the minimum value $y_k^{min}$ of the quantization error or larger than the maximum value $y_k^{max}$ of the quantization error. In such cases, if the calculated corrected value $Y_k$ is larger than the maximum value $y_k^{max}$, the maximum value $y_k^{max}$ itself may be outputted to the converting unit 3 as the corrected value, and if the corrected value $Y_k$ is smaller than the minimum value $y_k^{min}$, the minimum value $y_k^{min}$ itself may be outputted to the converting unit 3 as the corrected value $Y_k$. Still further, as the corrected value calculation method other than the LMS method using the neighboring encoded values $y_{k-1}$ and $y_{k+1}$, an approximation method using so-called Fourier-conversion or an arithmetic average approximation method may be employed.

[II] 2nd Embodiment

Figures 3A, 3B:
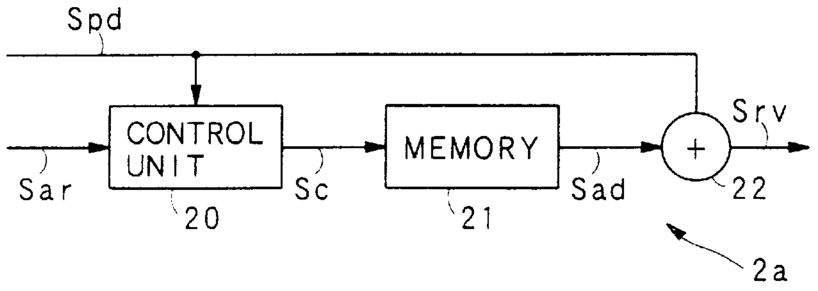

Next, the second embodiment of the present invention will be described with reference to FIGS. 3A and 3B. FIG. 3A is a block diagram showing the detailed configuration of the error correction unit according to the second embodiment of the present invention. In the first embodiment, the quantization error range is obtained from the inputted encoded value, and then the corrected value $Y_k$ of the encoded value $y_k$ is calculated by using the quantization error ranges corresponding to the encoded values $y_{k-1}$ and $y_{k+1}$ of the frequency bands neighboring to each other on the frequency axis. In the error correcting unit of the second embodiment, the corrected values for each frequency bands are calculated in advance by experiments, and those values are stored in a memory in a form of table. At the time of correction, the corrected values stored in the memory is read out by using encoded value and bit allocation information extracted by the information extracting unit 1 as address information, and the read-out values are outputted to the converting unit 3 as corrected data Srv.

In the audio information decoding device of the second embodiment, the elements other than the error correcting unit are identical to those in the audio information decoding device S of the first embodiment, and hence the detailed description of those identical elements will be omitted. As shown in FIG. 3A, the error correction unit 2*a* of the second embodiment includes a control unit 20, a memory 21, and an adder 22.

Next, the operation will be described. First, the audio data Spd inputted to the error correction unit 2*a* is supplied to the control unit 20 and the adder 22, and the allocation data Sar is supplied to the control unit 20. The memory 21 stores a table T shown in FIG. 3B, which includes addition correction value Cp, l. The addition correction values Cp, l are determined by a number p and a bit number l. The number p is determined based on the magnitude relation between the encoded values $y_{k-1}$ and $y_{k+1}$ of the frequency bands neighboring to the frequency band of the encoded value $y_k$ to be corrected on the high- and low-frequency sides on the frequency axis. The bit number l is included in the bit allocation information possibly transmitted to the audio information decoding device of the second embodiment. The addition correction value Cp, l is added to the encoded value $y_k$ to generate the corrected value $Y_k$ which is outputted as the corrected data Srv.

The control unit 20 generates a control signal Sc and supplies it to the memory 21. The control signal Sc is used to select the addition correction value Cp, l to be outputted from the memory 21 based on the encoded values $y_k$, $y_{k-1}$ and $y_{k+1}$ and the bit allocation information (i.e., allocation bit number l) included in the allocation data Sar. The memory 21 supplies the addition correction value Cp, l designated by the control signal Sc to the adder 22 as the addition data Sad. The adder 22 adds the addition correction value Cp, l to the encoded value $y_k$ included in the audio data Spd to calculate the corrected value $Y_k$, and supplies it to the converting unit 3 as the corrected data Srv.

Next, the description will be given of the method of setting the addition correction values Cp, l according to the second embodiment. The addition correction value Cp, l is calculated, in advance, on the basis of the distribution of the true values in the audio information before the encoding, which is obtained using the audio information corresponding to actual music. As parameters for obtaining the distribution, the quantizing value level obtained by quantizing the true value in the adjacent frequency band in the audio information, or bit number allocated in encoding the true value, or concrete frequency value in the frequency band, for example. Considering that the table T needs lager storage capacity as the number of parameters is large, in the second embodiment described above, the distribution of the true value is obtained using the magnitude relation of the quantized value levels of the true values in the adjacent frequency bands and the bit number allocated in encoding the true value, and the addition correction value Cp, l is obtained in advance in four steps described below.

Specifically, as the first step of the addition correction value calculation, the audio information is pseudo-encoded to obtain the encoded value on the frequency axis (i.e., in the frequency domain). Namely, audio information Xn is converted to the value on the frequency axis by using the time-frequency converting function F(x) used in the encoding. That is, assuming that the audio information Xn is:

Xn={x(n), x(n+1), . . . , x(n+N), (wherein x(n) is a sample value of audio information before encoding, and n is a number on the time axis), the value Yn on the frequency axis is calculated as follows by using the time-frequency converting function F(X):

$$Yn=F(Xn)=\{y_n(0),\ y_n(1),\ \ldots,\ y_n(N)\}.$$

Next, as the second step, the value $y_n(k)$ calculated in the first step is quantized using all quantizing levels presumable at the time of decoding. Namely, the value $y_n(k)$ is quantized by the quantizing level $q_l$ (l is all allocation bit number possibly used at the time of decoding, and specifically, l=1, 2, 3, . . . , m). Then, the quantized value $y_{n,l}(k)$ is calculated as follows:

$$Y_{n,l}(k)=\|yn(k)\|_{ql},\ (\|\ \|_{ql} \text{ represents quantization}).$$

Then, as the third step, the quantization error between the quantized value $y_{n,l}(k)$ and the value $y_n(k)$ before quantization is actually obtained. Namely, the actual error $\Delta_{n,l}(k)$ between the quantized value $y_{n,l}(k)$ calculated by the quantization and the $y_n(k)$ before the quantization is obtained for each of the number n on the time axis, the allocation bit number l and the number k on the frequency axis by the following equation:

$$\Delta_{n,l}(k)=y_n(k)-y_{n,l}(k).$$

Finally, as the fourth step, the error $\Delta_{n,l}(k)$ is calculated for a lot of audio information, and the average values of them are stored in the memory 21 as the addition correction values Cp, l in the table T. In other words, four conditions are set in accordance with the magnitude relation between the quantized value $y_{n,l}(k)$ and the quantized values $y_{n,l}(y-1)$ and $y_{n,l}(y+1)$. For each condition, based on the total sum $D_{p,l}$ of the error $\Delta_{n,l}(k)$ (here, since p is the number of condition, and the quantized value before and after are used, p is one of 0 to 3, corresponding to the conditions ① to ④ in FIG. 3B) and a number Mp, l of the error $\Delta_{n,l}(k)$ used in calculating the total sum Dp, l, the addition correction value Cp, l is obtained by the following processing.

First, the total sum Dp, l is calculated for each condition:

$$\text{If } y_{n,l}(k-1)>y_{n,l}(k) \text{ and } y_{n,l}(k)>y_{n,l}(k+1),\ D_{0,l}=D_{0,l}+\Delta_{n,l}(k),\ M_{0,l}=M_{0,l}+1 \quad \text{CONDITION 1:}$$

$$\text{If } y_{n,l}(k-1)<y_{n,l}(k) \text{ and } y_{n,l}(k)>y_{n,l}(k+1),\ D_{1,l}=D_{1,l}+\Delta_{n,l}(k),\ M_{1,l}=M_{1,l}+1 \quad \text{CONDITION 2:}$$

$$\text{If } y_{n,l}(k-1)>y_{n,l}(k) \text{ and } y_{n,l}(k)<y_{n,l}(k+1),\ D_{2,l}=D_{2,l}+\Delta_{n,l}(k),\ M_{2,l}=M_{2,l}+1 \quad \text{CONDITION 3:}$$

$$\text{If } y_{n,l}(k-1)<y_{n,l}(k) \text{ and } y_{n,l}(k)<y_{n,l}(k+1),\ D_{3,l}=D_{3,l}+\Delta_{n,l}(k),\ M_{3,l}=M_{3,l}+1 \quad \text{CONDITION 4:}$$

Then, the values $D_{0,l}$ to $D_{3,l}$ are calculated for a lot of actual audio information, and the addition correction value Cp, l is calculated from them as follows:

$$Cp,\ l=Dp,\ l/Mp,\ l$$

Thereafter, the table T shown in FIG. 3B is produced from the addition correction values Cp, l thus calculated, and stored in the memory 21. The contents of the table T is read out based on the control signal Sc, and added to the encoded value $y_k$ by the adder 22 to calculate the corrected value $Y_k$ serving as the corrected data Srv. At this time, the control unit 20 produces the control signal Sc so that the memory 21 reads out the addition correction value Cp, l corresponding to the following conditions on the basis of the magnitude relation of the encoded values $y_k$, $y_{k-1}$ and $y_{k-1}$ included in the audio data Spd and the bit allocation information included in the allocation data Sar, and supplies it to the adder 22.

TABLE 2

| No. | CONDITION | Cp,1 | $Y_k$ |
|---|---|---|---|
| $\hat{1}$ | $y_{k-1} > y_k$, $y_k > y_{k+1}$ | $C_{0,1}$ | $Y_k = C_{0,1} + y_k$ |
| $\hat{2}$ | $y_{k-1} < y_k$, $y_k > y_{k+1}$ | $C_{1,1}$ | $Y_k = C_{1,1} + y_k$ |
| $\hat{3}$ | $y_{k-1} > y_k$, $y_k < y_{k+1}$ | $C_{2,1}$ | $Y_k = C_{2,1} + y_k$ |
| $\hat{4}$ | $y_{k-1} < y_k$, $y_k < y_{k+1}$ | $C_{3,1}$ | $Y_k = C_{3,1} + y_k$ |

According to the error correction unit 2*a* of the second embodiment described above, the addition correction values Cp, l are calculated, in advance, on the basis of the error $\Delta_{n,l}(k)$ between the encoded value $y_k$ of the audio information and the audio information value before the compressive-encoding and the levels of the encoded values $y_{k-1}$ and $y_{k+l}$ in the neighboring frequency bands. Then, the addition correction values Cp, l are stored in the memory 21. The addition correction values Cp, l is read out from the memory 21 based on the allocation bit number and the encoded value $y_k$, and the corrected value $Y_k$ is calculated based on the addition correction value Cp, l and the encoded value $y_k$. Therefore, the quantization error of the audio information in the frequency band which is compressive-encoded with smaller bit number by the bit allocation at the time of compressive-encoding may be corrected, and the decoding accuracy of the audio information may be improved. In addition, by improving the decoding accuracy of audio information compressive-encoded by the conversion encoding for each frequency band, whole audio information may be decoded with high sound quality.

In the calculation of the addition correction value Cp, l in the second embodiment, the magnitude relation of the quantized values in the neighboring frequency bands and the allocation bit number are used as the parameters. Alternatively, the frequency value itself of the frequency band and the quantized value $y_{n,l}(k)$ itself may be used to calculate the addition correction value Cp, l. In that case, however, the number of the conditions (the maximum value of p) increases, and hence the storage capacity of the memory 21 should be increased and the production of the table T may be complicated to some degree.

In the calculation of the addition correction value Cp, l of the second embodiment, the addition correction value Cp, l is calculated using the quantized values of the neighboring frequency bands on the frequency axis. Alternatively, the quantized values of frequency bands, which are not neighboring to each other but close to each other, may be used. Alternatively, the quantized values of other frequency bands of only the low- or high-frequency side may be used to calculate the addition correction value.

Further, the value of the quantizing step $q_l$ used in the calculation of the addition correction value Cp, l may be different value due to the compression system of the encoding, even if the allocation bit number 1 is identical. More specifically, the value $y_n(k)$ in the processing after the first step is expressed as:

$$y_n(k)=\alpha_n(k)\times\beta_n(k),$$

and, in the second step of the process, the calculation of the quantized value $y_n(k)$ is performed as:

$$y_n(k)=\|\alpha_n(k)\|_{ql}\times\beta_n(k),$$

and, $\alpha_n(k)$ is quantized by a uniform quantizing step $q_l$ with allocation bit number 1. In this case, the addition correction value Cp, 1 is calculated for only $y_n(k)=\|\alpha_n(k)\|_{ql}$, and subsequent process is performed as follows to calculate the corrected value $Y_k$.

TABLE 3

| No. | CONDITION | Cp,1 | $Y_k$ |
|---|---|---|---|
| $\hat{1}$ | $y_{k-1} > y_k$, $y_k > y_{k+1}$ | $C_{0,1}$ | $Y_k = (C_{0,1} + \alpha_k) \times \beta_k$ |
| $\hat{2}$ | $y_{k-1} < y_k$, $y_k > y_{k+1}$ | $C_{1,1}$ | $Y_k = (C_{1,1} + \alpha_k) \times \beta_k$ |
| $\hat{3}$ | $y_{k-1} > y_k$, $y_k < y_{k+1}$ | $C_{2,1}$ | $Y_k = (C_{2,1} + \alpha_k) \times \beta_k$ |
| $\hat{4}$ | $y_{k-1} < y_k$, $y_k < y_{k+1}$ | $C_{3,1}$ | $Y_k = (C_{3,1} + \alpha_k) \times \beta_k$ |

At this time, the encoded value $y_k$ is expressed as:

$$y_k=\alpha_k\times\beta_k,$$

and $\alpha_k$ and $\beta_k$ are included in the audio data Sdp as a part of the encoded value $y_k$.

[III] 3rd Embodiment

Figure 4A:
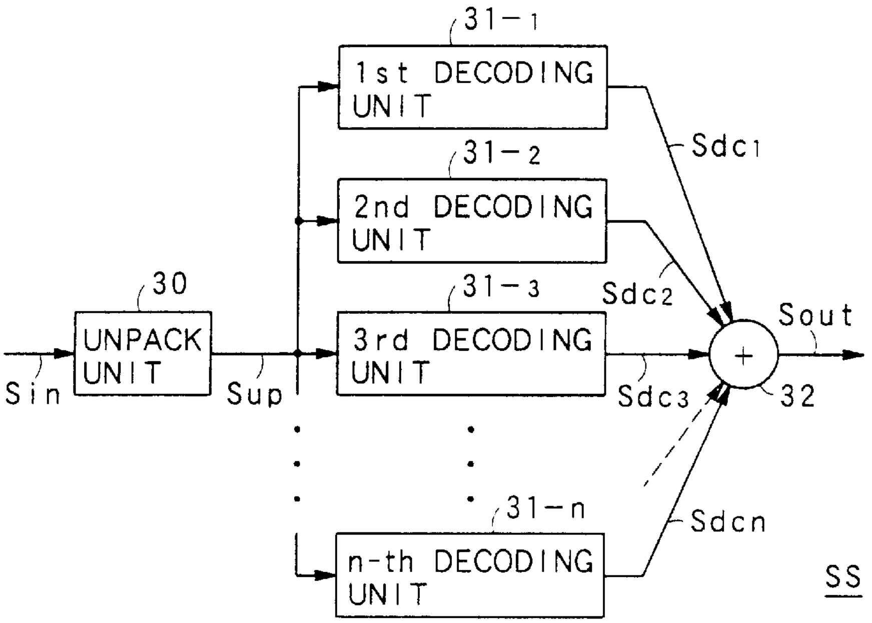
Figure 4B:
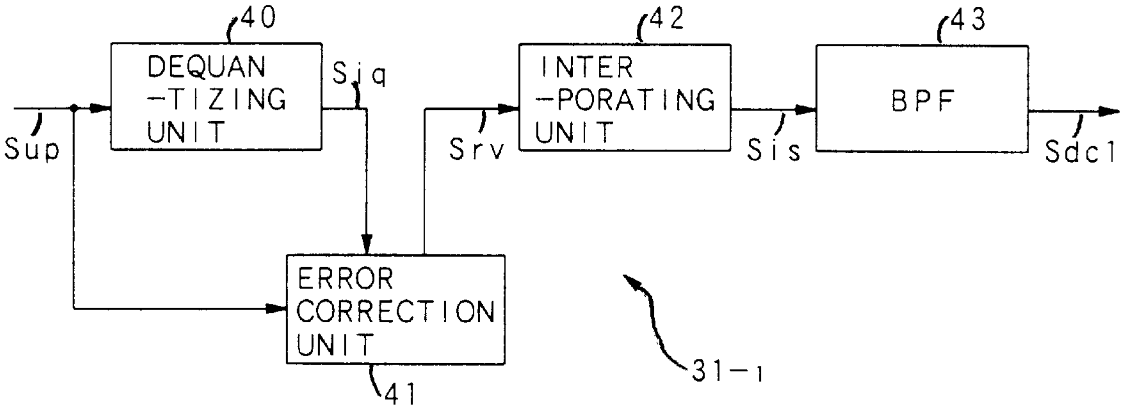

Next, the third embodiment of the present invention will be described with reference to FIGS. 4A and 4B. FIGS. 4A and 4B are block diagrams showing the detailed configuration of the error correction unit according to the third embodiment.

The first and the second embodiments described above are directed to the cases where the present invention is applied to the audio information decoding device which decodes audio information encoded by the conversion encoding and then transmitted. The third embodiment described below is directed to the case where the present invention is applied to an audio information decoding device which decodes audio information encoded by sub-band encoding and then transmitted.

As shown in FIG. 4A, the audio information decoding device SS of the third embodiment includes an unpack unit 30, first decoding unit $\mathbf{31}_{-1}$ to n-th decoding unit $\mathbf{31}_{-n}$, and an adder 32.

The operation will be described. To the unpack unit 30, audio information Sin, which was sub-band encoded, is inputted from an information storage medium or via broadcasting radio wave. Similarly to the conversion encoding in the first and the second embodiments, the audio information Sin was compressive-encoded with the bit allocation in consideration of the masking effect for plural frequency bands after being divided into plural frequency bands. The audio information Sin include, in addition to the audio information body, bit allocation information indicating the bit allocation for the plural frequency bands. The unpack unit 30 separates the audio information Sin into the audio information body and the bit allocation information, generates the separated data Sup including the respective information separately, and outputs it to the decoding units $\mathbf{31}_{-1}$ to $\mathbf{31}_{-n}$.

The decoding units $\mathbf{31}_{-1}$ to $\mathbf{31}_{-n}$ decodes the audio information body included in he separate data Sup by using the bit allocation information included in the separated data Sup for the frequency bands allocated to them in correspondence with the original sub-band coding, generates the band decoded data Sdcl to Sdcn and supply them to the adder 32. The adder 32 adds the band decoded data Sdcl to Sdcn to produce the decoded data Sout serving as decoded audio information, and outputs it outside. In the decoding process by the audio decoding device SS, unlike the decoding process of the above mentioned conversion encoding, audio information at the respective steps are decoded in the time domain.

Next, the detailed configuration and operation of the decoding units $\mathbf{31}_{-1}$ to $\mathbf{31}_{-n}$ will be described with reference to FIG. 4B. Since the decoding units $\mathbf{31}_{-1}$ to $\mathbf{31}_{-n}$ have the same configuration except for that the frequency bands of the audio data are different, only the detailed configuration and operation only of the first decoding unit $\mathbf{31}_{-1}$ will be described. As shown in FIG. 4B, the first decoding unit $\mathbf{31}_{-1}$ includes a dequantizing unit 40, an error correcting unit 41, an interporating unit 42, and a band-pass filter 43.

Next, the operation will be described. The separated data Sup inputted to the first decoding unit $\mathbf{31}_{-1}$ is supplied to the dequantizing unit 40 and the error correcting unit 41. The dequantizing unit 40 applies dequantization processing, which corresponds to the quantization processing at the time of the sub-band encoding, onto the audio information body included in the separated data Sup by using the bit allocation information included in the separated data Sup, generates dequantized data Siq and outputs it to the error correcting unit 41. The error correcting unit 41 corrects the quantization error included in the dequantized audio information body by the correction processing described later which uses the dequantized audio information body included in the dequantized data Siq and the bit allocation information included in the separate data Sup, generates the corrected data Srv including the audio information on the time axis, and supplies it to the interporating unit 42. The interporating unit 42 applies so-called oversampling processing (i.e., a processing inserting zero data for necessary bit number) onto the audio information included in the corrected data Srv to generate interporated data Sis, and supplies it to the band-pass filter 43. The band-pass filter 43 stops the interporated data belonging to the frequency bands other than the frequency band corresponding to the first decoding unit $\mathbf{31}_{-1}$ and supplies the interporated data Sis belonging to the frequency band corresponding to the first decoding unit $\mathbf{31}_{-1}$ to the adder 32 as the decoded data Sdcl.

Next, the detailed operation of the error correcting unit 41 will be described. The error correcting unit 41 performs quantization error correction processing, similar to the error correction unit 2 of the first embodiment and the error correction unit 2*a* of the second embodiment, by using the dequantized audio information and the bit allocation information to generate the corrected data Srv. In the case that the error correcting unit 41 is configured to generate the corrected data by the processing similar to the error correction unit 2 of the first embodiment, the error correcting unit 41 is configured by the error range calculating unit 10 and the correction processing unit 11 for executing the same operation as the first embodiment. Then, the error correction processing is performed, in which the encoded value $y_k$ is replaced with the encoded value ${}_by(k)$ dequantized by the dequantizing unit 40, thereby to generate the corrected value ${}_by(k)$ to be included in the corrected data Srv. In this case, it is noted that the parameter "k" should be changed from the parameter in the first embodiment which indicates the frequency axis to the parameter which indicates time axis.

On the other hand, in the case that the error correcting unit 41 is configured to generated the corrected data Srv in the same processing as the error correction unit 2*a* of the second embodiment, the error correcting unit 41 is configured by the control unit 20 and the memory 21 for executing the same operation as the second embodiment. Then, the addition correction values Cp, l constituting the table T are produced by the processing in which the value $y_n(k)$ before the quantization in the second embodiment is replaces with the encoded value ${}_by(k)$ dequantized by the dequantizing unit 40, and the corrected value ${}_bY(k)$ to be included in the corrected data Srv is generated by using the addition correction values Cp, l. Also in this case, the parameter "k" should be changed to the parameter indicating the time axis.

As described above, according to the operation of the audio information decoding device SS of the third embodiment, the decoding accuracy can be improved, like the first and the second embodiment, for the decoding processing of the audio information which was encoded by the sub-band encoding of frequency band unit.

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No.11-273084 filed on Jun. 13, 1997 including the specification, claims, drawings and summary is incorporated herein by reference in its entirety.

What is claimed is:

1. A quantization error correcting device for correcting quantization error included in audio information at the time of decoding, the audio information being divided into a plurality of frequency bands and compressive-encoded for each frequency band with bit allocation determined based on audible frequency characteristic, the device comprising:

an allocation data generating unit for extracting bit allocation information from the audio information and for generating allocation data including the bit allocation information;

a detecting unit for detecting, based on the bit allocation information indicating bit allocation and encoded values of the compressive-encoded audio information, a range of quantization error indicating a range in which audio information value before compressive-encoding corresponding to the encoded audio information, a range of quantization error indicating a range in which audio information value before compressive-encoding corresponding to the encoded value exists; and an outputting unit for outputting a decoded value corresponding to one of the encoded values based on the detected range of quantization error and the ranges of quantization errors of other correlated ones of the encoded values.

2. The device according to claim 1, wherein the outputting unit corrects the quantization error corresponding to said one of the encoded value using Least Mean Square method based on the detected range of the quantization error and the ranges of the quantization errors of the other correlated ones of the encoded values, and outputs the decoded value.

3. The device according to claim 1, wherein said other correlated ones of the encoded value comprise the encoded values which are compressive-encoded in the frequency bands neighboring to the frequency band in which said one of the encoded value is obtained.

4. The device according to claim 1, wherein the compressive-encoding of the audio information comprises conversion encoding for each of the frequency bands.

5. The device according to claim 1, wherein the compressive encoding of the audio information comprises sub-band encoding for each of the frequency bands.

6. An audio information decoding device comprising:

a quantization error correcting device for correcting quantization error included in audio information at the time of decoding, the audio information being divided into a plurality of frequency bands and compressive-encoded for each frequency band with bit allocation determined based on audible frequency characteristic, comprising:

an allocation data generating unit for extracting bit allocation information from the audio information and for generating allocation data including the bit allocation information;

a detecting unit for detecting, based on the bit allocation information indicating bit allocation and encoded values of the compressive-encoded audio information, a range of quantization error indicating a range in which audio information value before compressive-encoding corresponding to the encoded value exists; and an outputting unit for outputting a decoded value corresponding to one of the encoded values based on the detected range of quantization error and the ranges of quantization error of other correlated ones of the encoded values; and a decoding unit for applying decoding processing corresponding to the compressive-encoding of the audio information onto the outputted decoded value and for outputting decoding result.

7. A quantization error correcting device for correcting quantization error included in audio information at the time of decoding, the audio information being divided into a plurality of frequency bands and compressive-encoded for each frequency band with bit allocation determined based on audible frequency characteristic, the device comprising:

a specifying unit for specifying a level of the encoded value in other correlated ones of the encode values;

a calculating unit for calculating correction values based on, at least, the specified level and an error between the encoded value of the compressive-encoded audio information and audio information value before compressive-encoding;

a memory for storing the correction values for correcting the encoded values for each frequency band; and an outputting unit for reading out the correction value from the memory based on the bit allocation information indicating the bit allocation and the encoded value, and for outputting decoded value corresponding to the encoded value for each frequency band based on the correction value read out from the memory and the encoded value.

8. The device according to claim 7, wherein the compressive-encoding of the audio information comprises conversion encoding for each of the frequency bands.

9. The device according to claim 7, wherein the compressive encoding of the audio information comprises sub-band encoding for each of the frequency bands.

10. An audio information decoding device comprising:

a quantization error correcting device for correcting quantization error included in audio information at the time of decoding, the audio information is frequency band with bit allocation determined based on audible frequency characteristic, comprising:

a specifying unit for specifying a level of the encoded value in other correlated ones of the encode values;

a calculating unit for calculating correction values based on, at least, the specified level and an error between the encoded value of the compressive-encoded audio information and audio information value before compressive-encoding;

a memory for storing the correction values for correcting the encoded values for each frequency band; and an outputting unit for reading out the correction value from the memory based on the bit allocation information indicating the bit allocation and the encoded value, and for outputting decoded value corresponding to the encoded value for each frequency band based on the correction value read out from the memory and the encoded value; and a decoding unit for applying decoding processing corresponding to the compressive-encoding of the audio information onto the outputted decoded value and for outputting decoding result.

11. A quantization error correcting method for correcting quantization error included in audio information at the time of decoding, the audio information being divided into a plurality of frequency bands and compressive-encoded for each frequency band with bit allocation determined based on audible frequency characteristic, the method comprising the steps of:

extracting bit allocation information from the audio information;

generating allocation data including the bit allocation information;

detecting, based on the bit allocation information indicating bit allocation and encoded values of the compressive-encoded audio information, a range of quantization error indicating a range in which audio information value before compressive-encoding corresponding to the encoded value exists; and outputting a decoded value corresponding to one of the encoded values based on the detected range of quantization error and the ranges of quantization error of other correlated ones of the encoded values.

12. The method according to claim 11, wherein the outputting step corrects the quantization error corresponding to said one of the encoded value using Least Mean Square method based on the detected range of the quantization error and the ranges of the quantization errors of the other correlated ones of the encoded values, and outputs the decoded value.

13. The method according to 11, wherein said other correlated ones of the encoded value comprise the encoded values which are compressive-encoded in the frequency bands neighboring to the frequency band in which said one of the encoded value is obtained.

14. The method according to claim 11, wherein the compressive-encoding of the audio information comprises conversion encoding for each of the frequency bands.

15. The method according to claim 11, wherein the compressive encoding of the audio information comprises sub-band encoding for each of the frequency bands.

16. An audio information decoding method comprising the steps of:

correcting quantization error included in audio information at the time of decoding, the audio information being divided into a plurality of frequency bands and compressive-encoded for each frequency band with bit allocation determined based on audible frequency characteristic, the correcting step comprising the steps of:

extracting bit allocation information from the audio information;

generating allocation data including the bit allocation information;

detecting, based on the bit allocation information indicating bit allocation and encoded values of the compressive-encoded audio information, a range of quantization error indicating a range in which audio information value before compressive-encoding corresponding to the encoded value exists; and outputting a decoded value corresponding to one of the encoded values based on the detected range of quantization error and the ranges of quantization error of other correlated ones of the encoded values; and applying decoding processing corresponding to the compressive-encoding of the audio information onto the outputted decoded value and for outputting decoding result.

17. A quantization error correcting method for correcting quantization error included in audio information at the time of decoding, the audio information being divided into a plurality of frequency bands and compressive-encoded for each frequency band with bit allocation determined based on audible frequency characteristic, the method comprising the steps of:

specifying a level of the encoded value in other correlated ones of the encode values;

calculating correction values based on, at least, the specified level and an error between the encoded value of the compressive-encoded audio information and audio information value before compressive-encoding;

storing the correction values for correcting the encoded values for each frequency band into a memory; and reading out the correction value from the memory based on the bit allocation information indicating the bit allocation and the encoded value, and for outputting decoded value corresponding to the encoded value for each frequency band based on the correction value read out from the memory and the encoded value.

18. The method according to claim 17, wherein the compressive-encoding of the audio information comprises conversion encoding for each of the frequency bands.

19. The method according to claim 17, wherein the compressive encoding of the audio information comprises sub-band encoding for each of the frequency bands.

20. An audio information decoding method comprising the steps of:

correcting quantization error included in audio information at the time of decoding, the audio information being divided into a plurality of frequency bands and compressive-encoded for each frequency band with bit allocation determined based on audible frequency characteristic, the correcting step comprising the steps of:

specifying a level of the encoded value in other correlated ones of the encode values;

calculating correction values based on, at least, the specified level and an error between the encoded value of the compressive-encoded audio information and audio information value before compressive-encoding;

storing the correction values for correcting the encoded values for each frequency band into a memory; and reading out the correction value from the memory based on the bit allocation information indicating the bit allocation and the encoded value, and for outputting decoded value corresponding to the encoded value for each frequency band based on the correction value read out from the memory and the encoded value; and applying decoding processing corresponding to the compressive-encoding of the audio information onto the outputted decoded value and for outputting decoding result.

* * * * *

UNITED STATES PATENT AND TRADEMARK OFFICE

CERTIFICATE OF CORRECTION

PATENT NO. : 6,629,283 B1
DATED : September 30, 2003
INVENTOR(S) : Toyama, Soichi It is certified that error appears in the above-identified patent and that said Letters Patent is hereby corrected as shown below:

Column 15,
Lines 1-4, delete "a range of quantization error indicating a range in which audio information value before compressive-encoding corresponding to the encoded audio information,".
Line 65, delete "encode values" and insert -- encoded values --.

Column 16,
Line 22, delete "is frequency band" and insert -- being frequency band --.
Line 26, delete "encode values" and insert -- encoded values --.

Column 18,
Lines 2 and 32, delete "encode values" and insert -- encoded values --.

Signed and Sealed this

Fifteenth Day of November, 2005

JON W. DUDAS
*Director of the United States Patent and Trademark Office*